United States Patent
George et al.

(10) Patent No.: US 12,437,915 B2
(45) Date of Patent: Oct. 7, 2025

(54) SIMPLE LITZ PLANAR ARCHITECTURE WITH MINIMAL VIAS TO REDUCE AC RESISTANCE

(71) Applicants: CENTRE FOR DEVELOPMENT OF ADVANCED COMPUTING (C-DAC), Thiruvananthapuram (IN); Indian Institute of Science (IISc), Karnataka (IN)

(72) Inventors: Subhash Joshi Tharayparambil George, Kerala (IN); Renji Varghese Chacko, Kerala (IN); Akhila Elappully Manikandan, Kerala (IN); Seena Somarajan, Kerala (IN); Vinod John, Karnataka (IN); Anurag Singh, Karnataka (IN)

(73) Assignees: CENTRE FOR DEVELOPMENT OF ADVANCED COMPUTING (C-DAC), Thiruvananthapuram (IN); INDIAN INSTITUTE OF SCIENCE (IISC), Bangalore (IN)

( * ) Notice: Subject to any disclaimer, the term of this patent is extended or adjusted under 35 U.S.C. 154(b) by 262 days.

(21) Appl. No.: 18/297,673

(22) Filed: Apr. 10, 2023

(65) Prior Publication Data
US 2023/0352235 A1    Nov. 2, 2023

(30) Foreign Application Priority Data
Apr. 8, 2022 (IN) .............................. 202241021129

(51) Int. Cl.
H01F 38/14  (2006.01)
H05K 1/11  (2006.01)

(52) U.S. Cl.
CPC ............. *H01F 38/14* (2013.01); *H05K 1/116* (2013.01)

(58) Field of Classification Search
None
See application file for complete search history.

(56) References Cited

U.S. PATENT DOCUMENTS

2019/0304670 A1*  10/2019  Chiyo ................. H01F 27/2804

* cited by examiner

*Primary Examiner* — Timothy J Thompson
*Assistant Examiner* — John B Freal
(74) *Attorney, Agent, or Firm* — Trupti P. Joshi

(57) ABSTRACT

Present disclosure discloses a simple litz planar architecture using minimal vias for reducing Alternating Current (AC) resistance. The simple litz planar structure comprises a plurality of conductor strands of a first layer, a plurality of conductor strands of a second layer; and a plurality of vias set. The first layer and the second layer are separated by an insulating layer and each vias set is configured to perform transposition between a corresponding conductor strand of the first layer and a conductor strand of the second layer. The disclosed transposition method is simple, easy to manufacture and consequently, cost effective. The reduction in AC resistance obtained using disclosed simple litz planar structure is similar to planar litz winding. Further reduction in AC resistance is obtained by implementing multi-transposition per layer in the disclosed simple litz winding structure.

6 Claims, 9 Drawing Sheets

SIMPLE LITZ PLANAR ARCHITECTURE WITH MINIMAL VIAS TO REDUCE AC RESISTANCE

CROSS-REFERENCE TO RELATED APPLICATION

The present application claims priority to Indian Patent Application No. 202241021129, filed on Apr. 8, 2022, the contents of which are hereby incorporated by reference herein in their entireties.

TECHNICAL FIELD

The present subject matter generally relates to a winding method for a planar magnetic technology, more particularly, to a simple litz planar architecture, to reduce Alternating Current (AC) resistance of magnetic components in the planar magnetic technology.

BACKGROUND

In planar magnetic technology, traces of Printed Circuit Board (PCB) form the windings of inductors and transformers. A hole is made available on the PCB to place a core of magnetic component such as transformer and inductor. Nowadays, the planar magnetic technology is popular due to its several advantages such as repeatability, small size, good thermal performances, and the like.

AC resistance of the winding is decided by two phenomena, skin effect and proximity effect. At higher frequencies, an AC flowing through a conductor shows a gradient of current density which is highest at surface of the conductor and decreases exponentially based on skin depth, which is a function of conductor material and frequency. So, an effective area of current flow reduces thereby, increasing the AC resistance. This phenomenon is called skin effect. A non-uniform current distribution in a current carrying conductor due to the influence of another current carrying conductor in its proximity is called proximity effect. The skin effect and the proximity effect are collectively called eddy current loss.

For a given conductor, eddy current loss increases with an exciting frequency. Conventionally, the influence of eddy current loss is minimized by using litz wire, since these wires have dimensions comparable to skin depth of copper at an operating frequency. In litz wire, the conductor is split into many strands, and these strands are insulated to reduce the skin effect. Such insulated conductor strands are twisted symmetrically with respect to centre line of the wire in order to achieve uniform current distribution in the strands, thereby, reducing the proximity effect. However, this technique is complex to implement and consequently, time consuming and not cost-effective.

The information disclosed in this background of the disclosure section is for enhancement of understanding of the general background of the invention and should not be taken as an acknowledgement or any form of suggestion that this information forms the prior art already known to a person skilled in the art.

SUMMARY

Embodiments of the present disclosure address the problems associated with the planar magnetic technology.

In an embodiment, there is a simple litz planar structure provided for reducing Alternating Current (AC) resistance. The simple litz planar structure comprises a plurality of conductor strands of a first layer, a plurality of conductor strands of a second layer and a plurality of vias set. The first layer and the second layer are separated by an insulating layer, and each vias set is configured to perform transposition between a corresponding conductor strand of the first layer and a conductor strand of the second layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING DRAWINGS

The accompanying drawings, which are incorporated in and constitute a part of this disclosure, illustrate exemplary embodiments and together with the description, serve to explain the disclosed principles. The same numbers are used throughout the figures to reference like features and components. Some embodiments of system and/or methods in accordance with embodiments of the present subject matter are now described below, by way of example only, and with reference to the accompanying figures.

Figure 1:
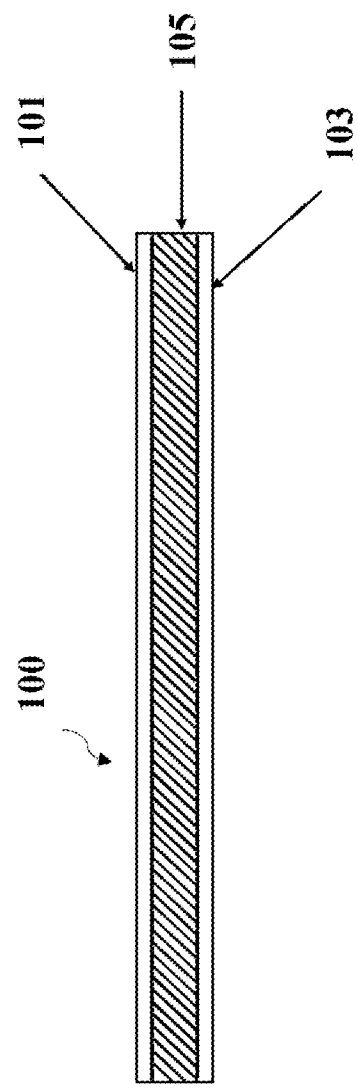
FIG. 1 illustrates a side view representation of a simple litz planar structure in accordance with some embodiments of the present disclosure.

It should be appreciated by those skilled in the art that any block diagrams herein represent conceptual views of illustrative systems embodying the principles of the present subject matter. Similarly, it will be appreciated that any flowcharts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternatives falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

In the following detailed description of embodiments of the disclosure, reference is made to the accompanying drawings which illustrates specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

Embodiments of the present disclosure provides a simple litz planar structure for reducing AC resistance of magnetic components in a planar magnetic technology. The present disclosure is related to a winding method called simple litz winding for two-layer PCB. The simple litz planar structure may, also, be referred as a simple litz planar winding structure or a simple litz planar PCB structure. In one embodiment, the simple litz planar structure can be implemented up to four-layer PCB. In the present disclosure, a single conductor trace of a required area, decided by current rating, is divided into a plurality of conductor strands that are parallel to each other. Among the parallel conductor strands, the conductor strand near to magnetic core (or slot for the magnetic core) is referred to as an innermost conductor strand and the conductor strand away from the magnetic core is referred to as an outermost conductor strand. In the disclosed simple litz planar structure, transposition is applied between the conductor strands when the conductor strand moves from one layer i.e., first layer to a next layer i.e., second layer, where the conductor strand position is changed from outer position to inner position and vice-versa. Any conducting material can be used for the conductor strands of the first layer and the conductor strands of the second layer. The conductor strands of the first layer and the conductor strands of the second layer are made of same conducting materials. In one embodiment, the conducting material is made of copper. Transposition is also applied between the conductor strands i.e., conductor strands that lie between the innermost and outermost conductor strands. To implement transposition in the simple litz structure, through-hole vias are used. The use of through-hole vias reduces time and complexity involved in fabrication process and consequently, the cost involved in fabricating the simple litz structure. Additionally, the reduction in AC resistance obtained with the simple litz structure as disclosed in the present disclosure is at par with the planar litz winding method.

In the simple litz planar structure of the present disclosure, when the single conductor trace is divided into a plurality of (parallel) conductor strands, the total conducting material area, for example, copper area remains same. This result in a Direct Current (DC) resistance close to the conventional planar winding structure. Since the DC resistance is maintained same in both i.e., the simple litz planar structure of the present disclosure and the conventional planar winding structure, this allows one-to-one comparison of AC resistance.

FIG. 1 illustrates a side view representation of a simple litz planar PCB in accordance with some embodiments of the present disclosure.

Figure 2A:
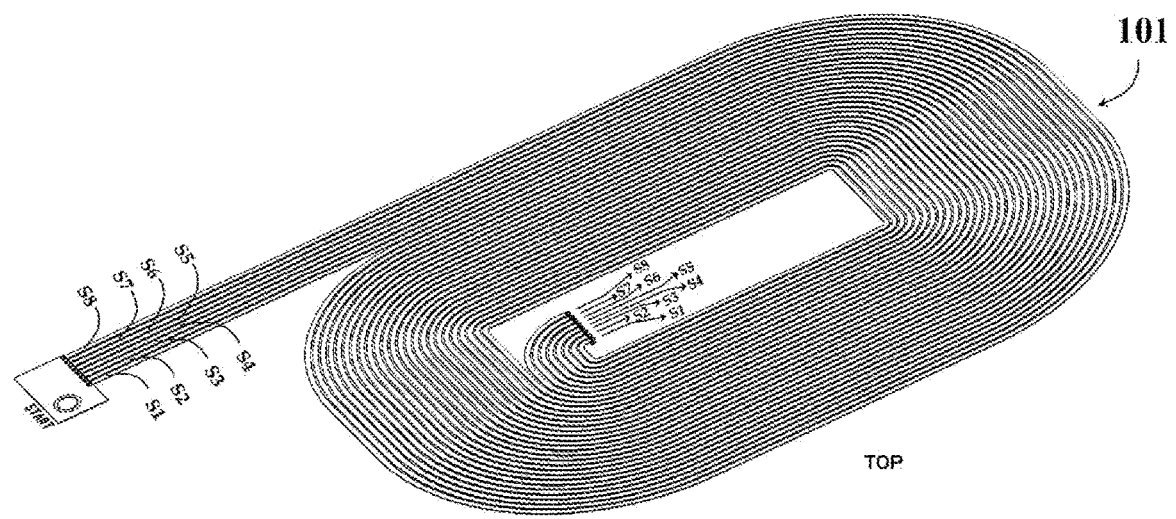
FIG. 2a illustrates a simple litz planar structure of a first layer in accordance with some embodiments of the present disclosure.
Figure 2B:
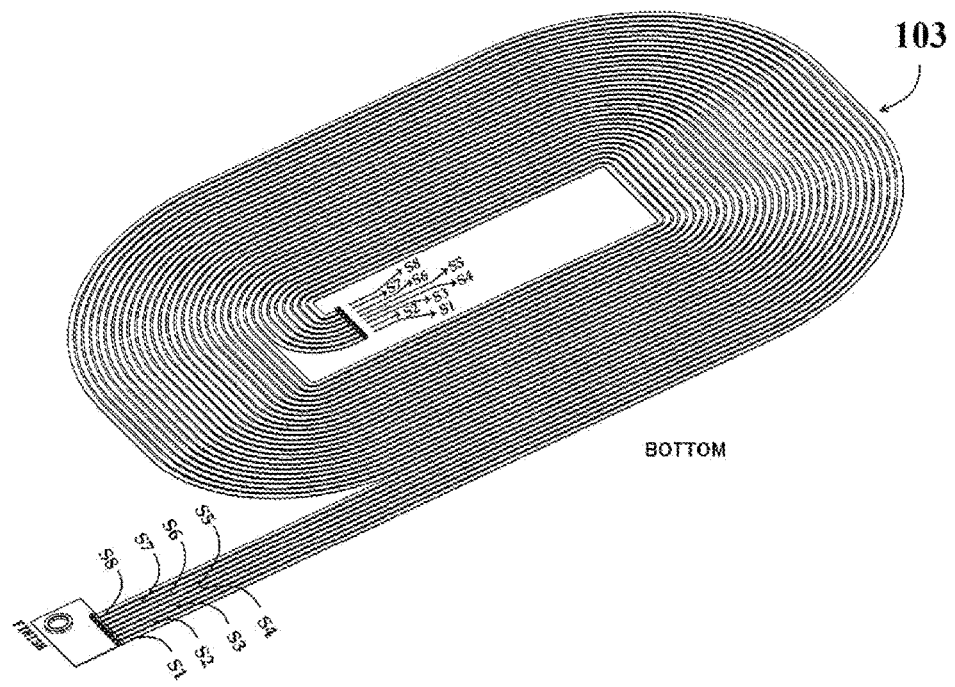
FIG. 2b illustrates a simple litz planar structure of a second layer in accordance with some embodiments of the present disclosure.

In the FIG. 1, the side view of the simple litz planar 100 comprises of two conductor layers i.e., a first layer 101 and a second layer 103. The two conductor layers i.e., the first layer 101 and the second layer 103 are separated by an insulating layer 105. To reduce the skin effect, each conductor layer is split into a plurality of conductor strands S1 to S8 as shown in FIG. 2a and FIG. 2b. FIG. 2a illustrates a simple litz planar structure of the first layer 101 split into a plurality of conductor strands S1 to S8. FIG. 2b illustrates a simple litz planar structure of the second layer 103 split into a plurality of conductor strands S1 to S8. The clearance or the gap between each conductor strands is limited by the manufacturing capability, and this clearance or this gap is filled by a polymer resin used in PCBs. The simple litz planar structure is arranged in one of a race-track geometry, a rectangular geometry, an octagonal geometry, and a spiral geometry for a PCB layout of the conductor strands of the first layer 101 and the conductor strands of the second layer 103. FIG. 2a and FIG. 2b are the examples of the simple litz planar structure arranged in a race-track geometry.

Figure 3A:
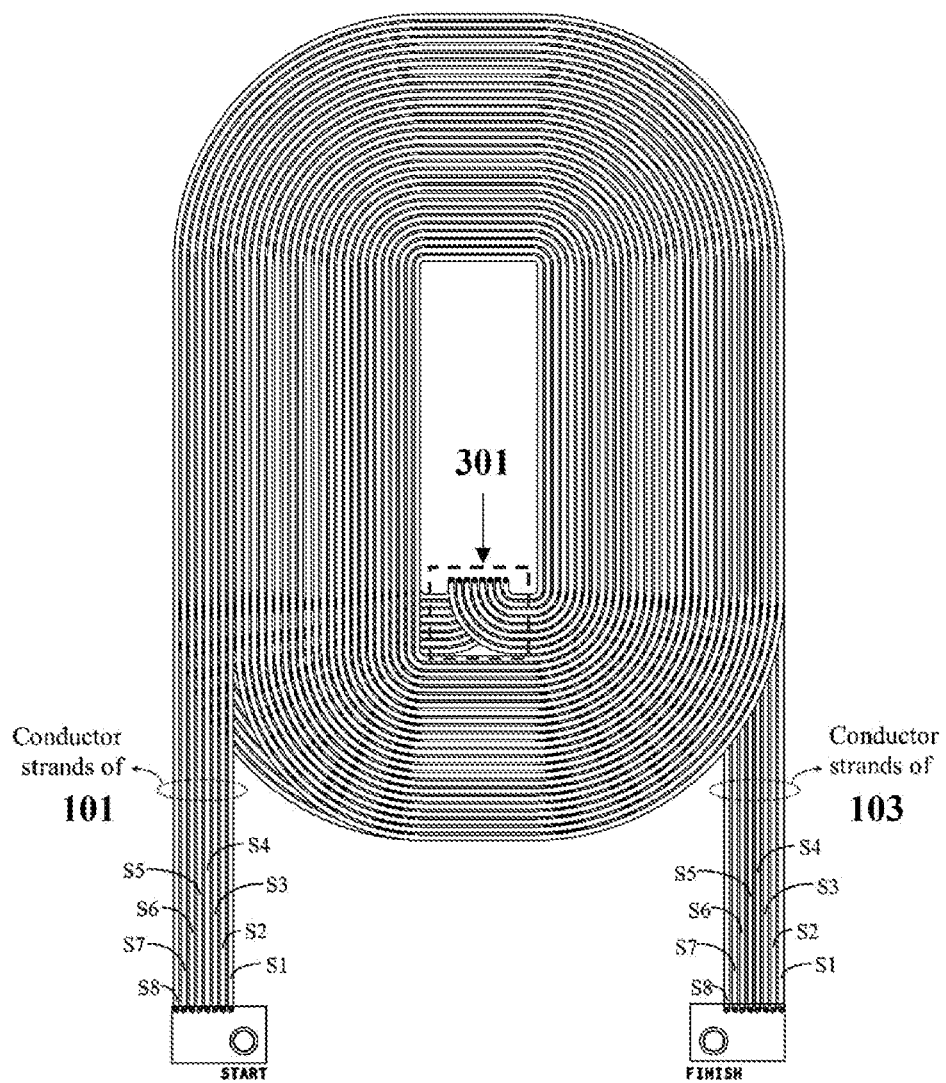
FIG. 3a illustrates transposition of conductor strands between a first layer and a second layer in accordance with some embodiments of the present disclosure.
Figure 3B:
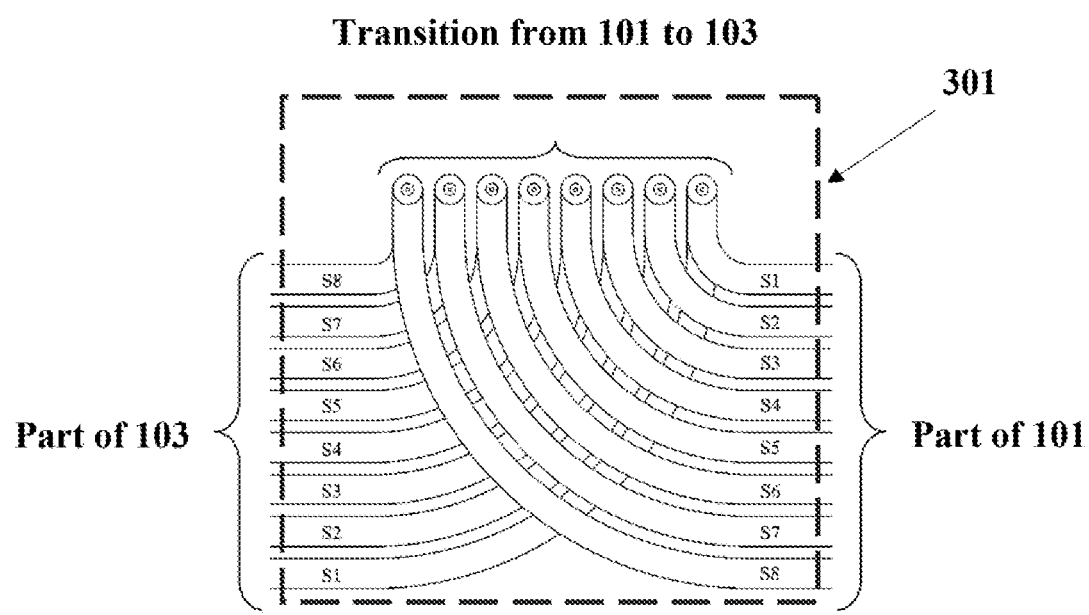
FIG. 3b illustrates an enlarged view of transposition of conductor strands between a first layer and a second layer in accordance with some embodiments of the present disclosure.

In the present disclosure, the transposition of the conductor strands is applied when the conductor strands move from one layer i.e., the first layer 101 to the next layer i.e., the second layer 103. FIG. 3a illustrates transposition of conductor strands between the first layer 101 and the second layer 103 and FIG. 3b illustrates an enlarged view of transposition of conductor strands between the first layer 101 and the second layer 103. Each of the two conductor layers i.e., the first layer 101 and the second layer 103 consists of four number of turns and each turn is split into a plurality of conductor strands, in this case 8 conductor strands named as S1 to S8. In one embodiment, the plurality of conductor strands may be any finite number of conductor strands and not limiting to 8 conductor strands. In this case, the 8 conductor strands S1 to S8 shown in FIG. 2a may be referred as a plurality of conductor strands of the first layer 101. Analogously, the 8 conductor strands S1 to S8 shown in FIG. 2b may be referred as a plurality of conductor strands of the second layer 103. The conductor strand of the first layer 101 and the conductor strand of the second layer 103 nearer to a magnetic core (or slot for the magnetic core) is referred to as inner (or innermost) conductor strand and the conductor strand away from the magnetic core (or slot for the magnetic core) is referred to as outer (or outermost) conductor strand. With reference to FIG. 3a, the conductor strand S1 of the first layer 101 is the inner (or innermost) conductor strand and S8 of the first layer 101 is the outer (or outermost) conductor strand. The conductor strands S2 to S7 of the first layer 101 are the intermediate conductor strands. With reference to FIG. 3a, the conductor strand S8 of the second layer 103 is the inner (or innermost) conductor strand and S1 of the second layer 103 is the outer (or outermost) conductor strand. The conductor strands S2 to S7 of the second layer 103 are the intermediate conductor strands. The plurality of conductor strands of the first layer 101 and the plurality of conductor strands of the second layer 103 are arranged to form a mirror image of each other.

The transposition of conductor strands between the first layer 101 and the second layer 103 is illustrated in FIG. 3b. With reference to FIG. 3b, the inner (or innermost) conductor strand S1 of the first layer 101 transitions to become the outer (or outermost) conductor strand S1 of the second layer 103. Similarly, the outer (or outermost) conductor strand S8 of the first layer 101 transitions to become the inner (or innermost) conductor strand S8 of the second layer 103. The intermediate conductor strands S2 to S7 of the first layer 101 transition to become corresponding intermediate conductor strands S2 to S7 of the second layer 103 as shown in FIG. 3b. In detail, the intermediate conductor strand S2 of the first layer 101 transitions to become corresponding intermediate conductor strand S2 of the second layer 103. Similarly, the intermediate conductor strand S3 of the first layer 101 transitions to become corresponding intermediate conductor strand S3 of the second layer 103 and the intermediate conductor strands S4 to S7 of the first layer 101 transition to become corresponding intermediate conductor strands S4 to S7 of the second layer 103. If the number of conductor strands in the first layer 101 and the second layer 103 are equal and odd number, the center conductor strand of the first layer 101 and the center conductor strand of the second layer 103 will continue to remain as central conductor strand. Even though the name i.e., S1 to S8 of the conductor strand in the first layer 101 and second layer 103 is retained as it is, the position of the conductor strands in the first layer 101 and second layer 103 are different.

Figure 4A:
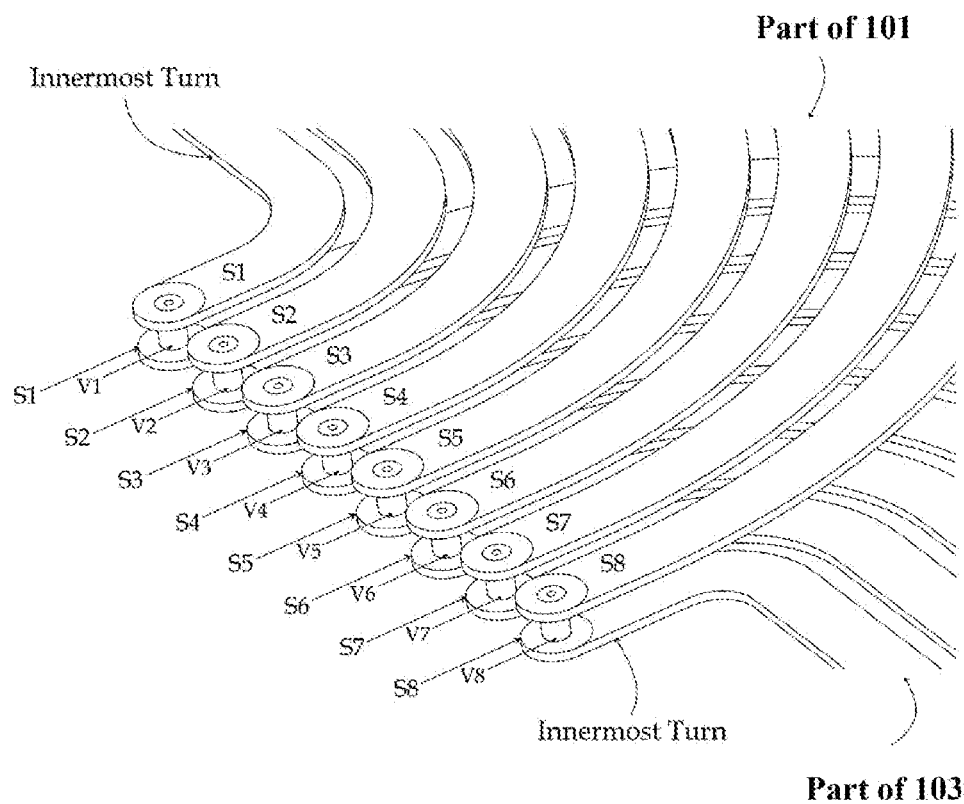
FIG. 4a illustrates a through hole vias used for transposition in accordance with some embodiments of the present disclosure.
Figure 4B:
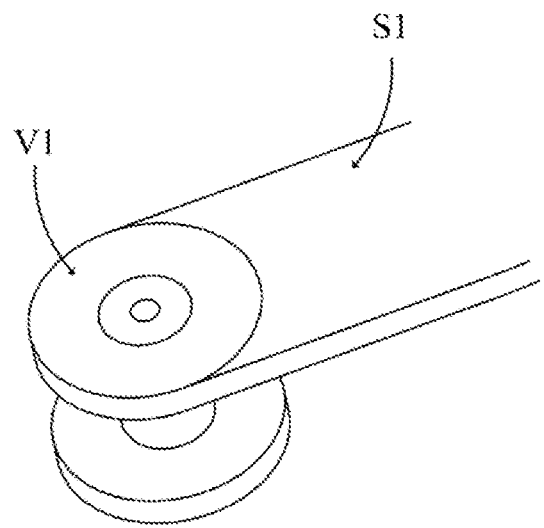
FIG. 4b illustrates a vias set with single via V1 in accordance with some embodiments of the present disclosure.
Figure 4C:
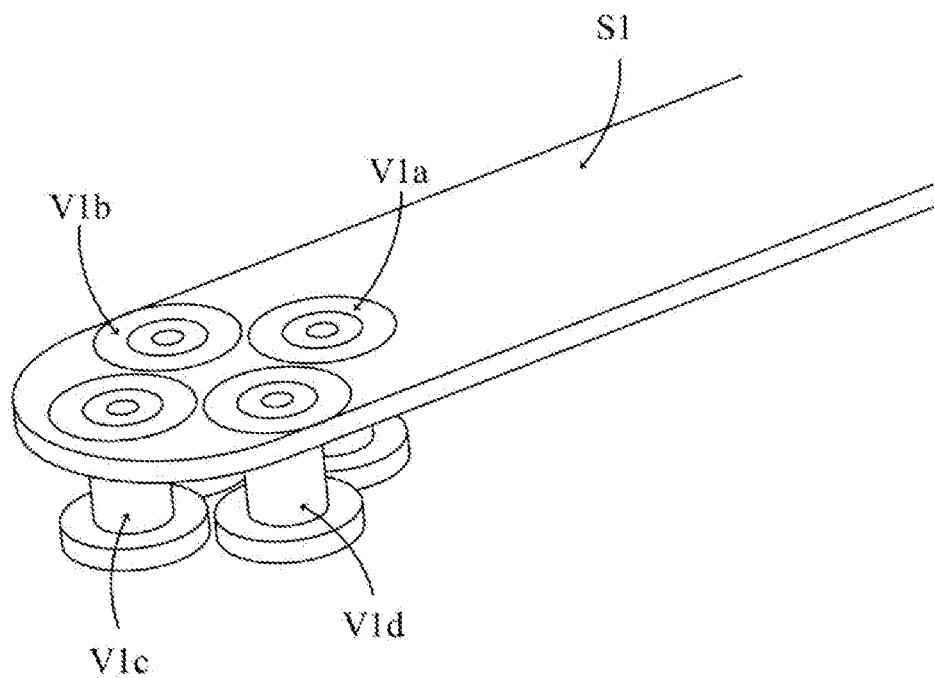
FIG. 4c illustrates a vias set with multiple smaller vias V1a to V1d in accordance with some embodiments of the present disclosure

In the present disclosure, the transposition of conductor strands between the first layer 101 and the second layer 103 is carried out using a plurality of vias set V1 to V8 as shown in FIG. 4a. Each vias set comprises one or more vias as shown in FIG. 4b and FIG. 4c. Each via in the vias set is a through hole via, shown in FIG. 4b. With reference to FIG. 4a, the vias set performs transposition of conductor strands by transitioning the inner (or innermost) conductor strands S1 of the first layer 101 to the outer (or outermost) conductor strands S1 of the second layer 103 and vice-versa i.e., transitioning the outer (or outermost) conductor strands S8 of the first layer 101 to the inner (or innermost) conductor strands S8 of the second layer 103. For the intermediate conductor strands, the vias set performs the transposition of intermediate conductor strands by swapping positions of intermediate conductor strands S2 to S7 of the first layer 101 with corresponding intermediate conductor strands S2 to S7 of the second layer 103 symmetrically. In detail, the vias set performs the transposition of the intermediate conductor strand S2 of the first layer 101 with corresponding intermediate conductor strand S2 of the second layer 103. Similarly, the vias set performs the transposition of the intermediate conductor strand S3 of the first layer 101 with corresponding intermediate conductor strand S3 of the second layer 103 and the transposition of the intermediate conductor strands S4 to S7 of the first layer 101 with corresponding intermediate conductor strands S4 to S7 of the second layer 103. The number of the plurality of vias set required is equal to the number of conductor strands of the first layer 101 and the second layer 103. For eight number of conductors strands, FIG. 4a shows eight vias set named as V1 to V8. A through hole via is sufficient to implement the transposition of conductor strands in the present disclosure. Hence, there is no need of blind via and/or buried via. The use of through hole via, unlike blind via and/or buried via, reduces time and complexity involved in fabrication process and consequently, the cost involved in fabricating the simple litz structure.

In order to reduce resistance of each vias set, each vias set V1, V2, . . . V8 shown in FIG. 4a is split into/replaced by multiple parallel vias i.e., more than one via shown in FIG. 4c. For instance, each vias set V1 is split into/replaced by four smaller vias V1a, V1b, V1c and V1d. The number of multiple parallel vias that can be implemented in each vias set is limited by fabrication or drilling capability.

Typically, the number of turns (of a conductor strand) that can occupy/be implemented in a two-layer PCB is limited. Several two-layer simple litz planar structure are to be connected in series where higher number of turns (of the conductor strand) are required. While connecting the simple litz planar structure in series, the rotation of the turns are to be made in the same direction.

Figure 5:
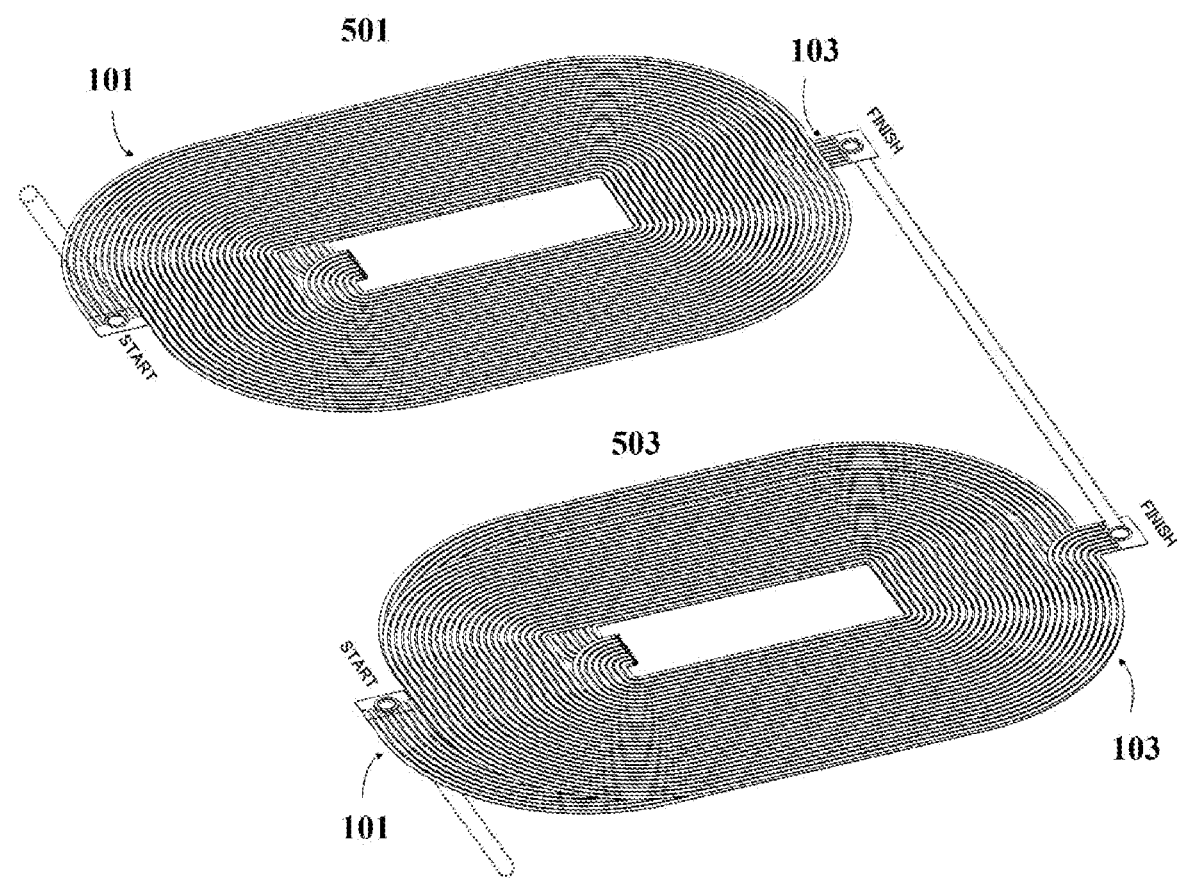
FIG. 5 illustrates a series connection of two layer PCBs for large number of turns in accordance with some embodiments of the present disclosure.

For instance, if the simple litz planar structure PCB shown in FIG. 3a is to be used for the series connection to increase number of turns (of the conductor strand) then a use of an interconnecting wire between the finish point of the first PCB and start point of the second PCB will be needed. Here, the term point is also referred as a terminal. This introduces an additional stray/parasitic element in the AC resistance of magnetic components. To prevent additional stray/parasitic element in the AC resistance of magnetic components, the layout of the simple litz planar structure is slightly modified as shown in FIG. 5. With reference to first simple litz planar structure 501, here the start point of the first layer 101 and the finish point of the second layer 103 are kept in the vertical center point. While doing this, half the turn (of the conductor strands) in the second layer 103 is lost/reduced. However, using the modified simple litz planar structure shown in FIG. 5, higher number of turns (of the conductor strands) is achieved without use of any interconnecting wires. In order to maintain the rotation of the turn (of the conductor strands) in the same direction, the second simple litz planar structure 503 is kept in upside-down arrangement (i.e., the second layer 103 is placed on top while the first layer 101 is placed on bottom as shown in FIG. 5) while stacking with the first simple litz planar structure 501 such that the finish point of the second layer 103 of first simple litz planar structure 501 is connected to the finish point of the second layer 103 of second simple litz planar structure 503.

FIG. 5 illustrates a series connection of two layer PCBs i.e., first simple litz planar structure 501 and second simple litz planar structure 503 for large number of turns. Both the first simple litz planar structure 501 and the second simple litz planar structure 503 are identical simple litz planar structure. The difference is that the second simple litz planar structure 503 is the upside-down arrangement of the first simple litz planar structure 501. Hence, the second layer 103 is on the top as compared to the first layer 101 in case of the second simple litz planar structure 503. The first simple litz planar structure 501 has in total seven and half number of turns (of conductor strands) from the two layers i.e., the first layer 101 and the second layer 103. Analogously, the second simple litz planar structure 503 has in total seven and half number of turns (of conductor strands) from the two layers i.e., the first layer 101 and the second layer 103. Hence, the series connection of two-layer PCBs i.e., first simple litz planar structure 501 and second simple litz planar structure 503 results in a total of 15 number of turns (of conductor strands).

For the first simple litz planar structure 501, winding of the conductor strands in the first layer 101 starts from the point START and after completing the 4 turns (of conductor strands), the winding of the conductor strands ends near to a magnetic core (or slot for the magnetic core). Thereafter, the windings of the conductor strands in the second layer 103 starts from the exact point where the winding of the conductor strands in the first layer 101 ends. This type of windings of the conductor strands is called wave winding. The windings of the conductor strands in the second layer 103 of the first simple litz planar structure 501 ends at the point FINISH.

To obtain the same rotation in the second simple litz planar structure 503, the second simple litz planar structure 503 is kept in upside-down arrangement and stacked with the first simple litz planar structure 501. In this case, the FINISH point of the first simple litz planar structure 501 and the second simple litz planar structure 503 coincides. For the series connection, the two FINISH points i.e., FINISH point of the first simple litz planar structure 501 and FINISH point of the second simple litz planar structure 503 are connected using soldering. Since these two FINISH points are geometrically at the same point, solder can be done with or without small length of wire. Start terminal of the winding of the conductor strands is connected to the START point of the first simple litz planar structure 501 and end terminal is connected to the FINISH point of the second simple litz planar structure 503.

When three two-layer simple litz planar structures are to be connected for the series connection, the third simple litz planar structure (not shown in FIG. 5) is positioned in the same way as that of the first simple litz planar structure 501.

Figure 6A:
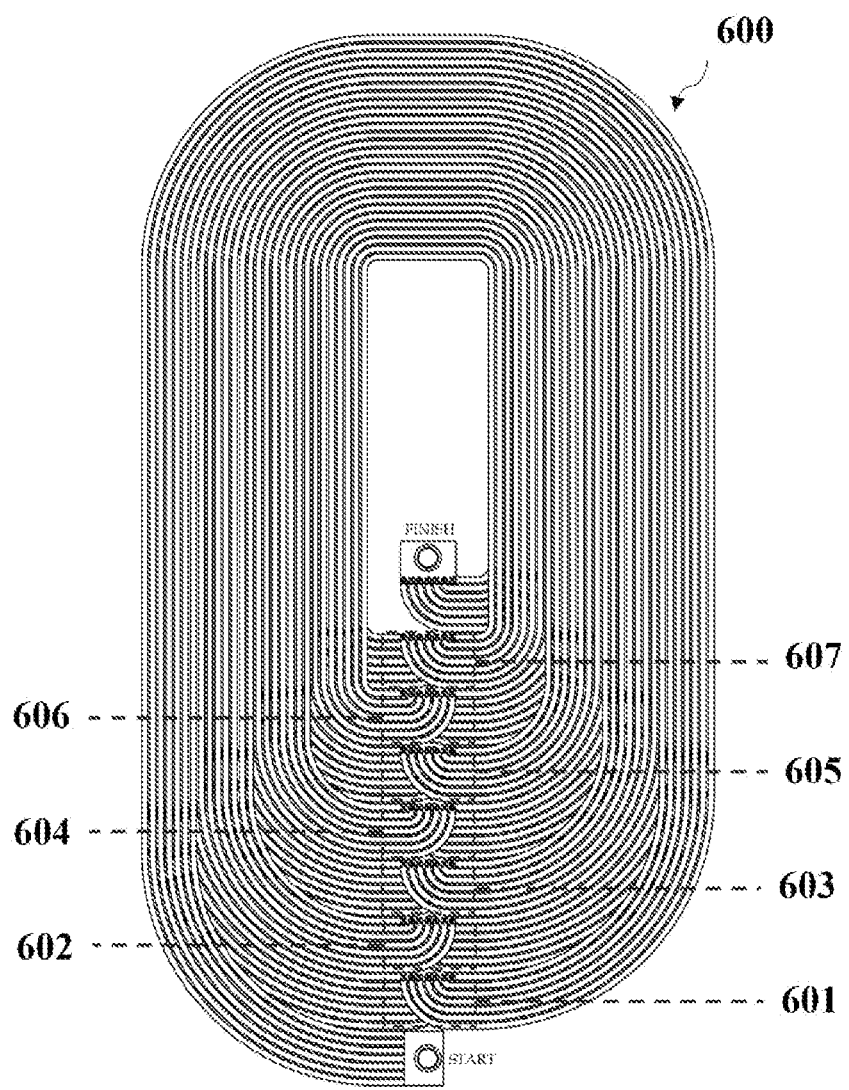
FIG. 6a illustrates a simple litz planar structure with multi-transposition in a layer in accordance with some embodiments of the present disclosure.

Generally, to obtain an appreciable reduction in AC resistance, single transposition is sufficient in a two-layer simple litz planar structures as shown in FIG. 3a and FIG. 3b. However, multiple vias set in a layer can be implemented in the simple litz winding structure 600 such that it results in multiple transposition 601 to 607 in the layer as shown in FIG. 6a. Even though the simple litz winding structure 600 shown in FIG. 6a increases the complexity of fabrication, the AC resistance is further reduced as compared to the single transposition shown in FIG. 3a and FIG. 3b. The implementation of more vias set for multiple transposition 601 to 607 may lead to increase in the via resistance, offsetting the benefits of multiple transposition 601 to 607 in reducing the AC resistance.

Figure 6B:
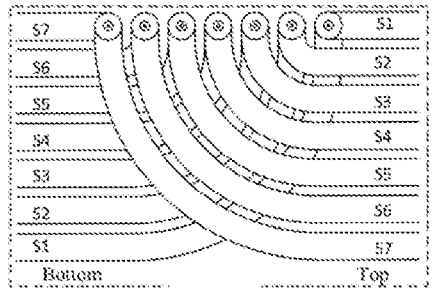
FIG. 6b illustrates enlarged views of the multi-transposition implemented in FIG. 6a in accordance with some embodiments of the present disclosure.
Figure 6B:
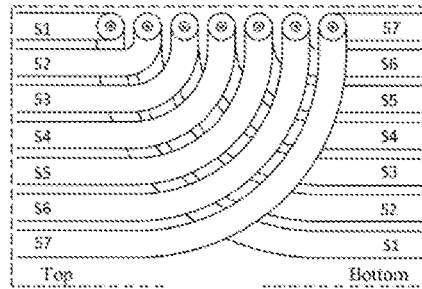
Figure 6B:
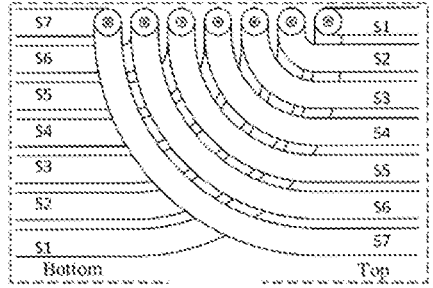
Figure 6B:
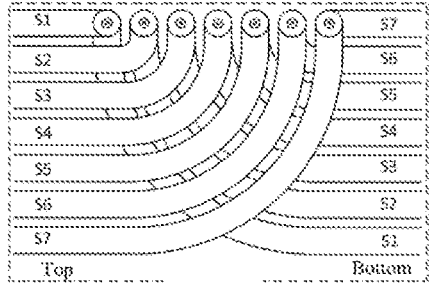
Figure 6B:
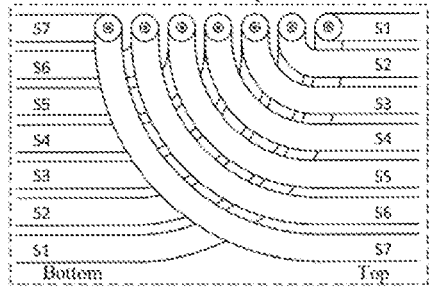
Figure 6B:
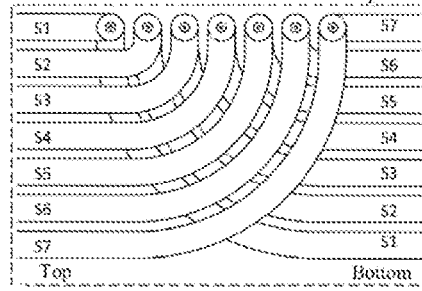
Figure 6B:
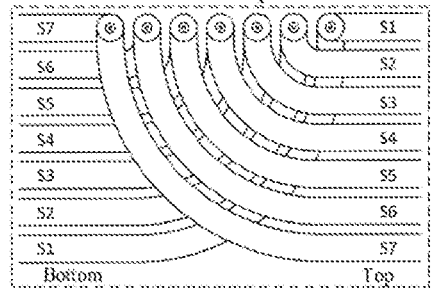

The simple litz winding structure 600 shown in FIG. 6a is a two-layer 7 conductor strand simple litz winding structure, having 8 number of turns (of conductor strands) in two layers. In multiple transposition structure, the transposition of conductor strands from one layer to the next layer is shown in FIG. 6b for simple litz winding structure 600. For the reference marked as 601, 603, 605 and 607 in FIG. 6b, the conductor strands transition from top to bottom whereas for the references marked as 602, 604 and 606, the conductor strands move from bottom to top. Hence, the conductor strands of the simple litz winding structure 600 undergo multiple transposition in a layer itself.

Some of the advantages of the present disclosure are listed below.

The present disclosure discloses a transposition method that is simple, easy to manufacture and consequently, cost effective.

The present disclosure discloses a transposition method that reduces the fabrication time and complexity of PCB as the litz winding structure is simple in design.

The reduction in AC resistance obtained using the disclosed simple litz planar structure is similar to a planar litz winding method.

In order to further reduce AC resistance, the present disclosure discloses multi-transposition per layer technique implemented on the simple litz winding structure.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

A description of an embodiment with several components in communication with each other does not imply that all such components are required. On the contrary, a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the disclosure of the embodiments of the invention is intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

REFERRAL NUMERALS:

| Reference number | Description |
| --- | --- |
| 101, 501 | First layer |
| 103, 503 | Second layer |

-continued

| REFERRAL NUMERALS: | |
|---|---|
| Reference number | Description |
| 105 | Insulating layer |
| S1 to S8 | Plurality of conductor strands |
| 301 | Transition from first layer 101 to second layer 103 |
| V1 to V8 | Plurality of vias set |
| V1a to V1d | Multiple parallel vias |
| 601, 603, 605, 607 | Conductor strands transition from top to bottom |
| 602, 604, 606 | Conductor strands transition from bottom to top |

We claim:

1. A simple litz planar structure for reducing Alternating Current (AC) resistance, the simple litz planar structure comprising:
   a plurality of conductor strands (S1-S8) of a first layer (101);
   a plurality of conductor strands (S1-S8) of a second layer (103);
   wherein the first layer (101) and the second layer (103) are separated by an insulating layer (105); and
   a plurality of vias set (V1-V8), wherein each vias set is configured to perform transposition between a corresponding conductor strand of the first layer (101) and a conductor strand of the second layer (103), wherein each vias set comprises more than one vias.

2. The simple litz planar structure as claimed in claim 1, wherein the conductor strands of the first layer (101) and the conductor strands of the second layer (103) are made of same conducting materials.

3. The simple litz planar stricture as claimed in claim 1, wherein the simple litz planar structure is arranged in one of a race-track geometry, a rectangular geometry, an octagonal geometry, and a spiral geometry for a PCB layout of the conductor strands of the first layer (101) and the conductor strands of the second layer (105).

4. The simple litz planar structure as claimed in claim 1, wherein the vias set performs transposition of conductor strands by transitioning inner and outer conductor strands (S1 and S8) of the first layer (101) to outer and inner conductor strands (S1 and S8) of the second layer (103) and vice-versa; and
   wherein the vias set performs the transposition of intermediate conductor strands by swapping positions of intermediate conductor strands (S2-S7) of the first layer (101) with corresponding intermediate conductor strands (S2-S7) of the second layer (103) symmetrically.

5. The simple litz planar structure as claimed in claim 1, wherein each via in the vias set is a through hole via.

6. The simple litz planar structure as claimed in claim 1, wherein the plurality of conductor strands (S1-S8) of the first layer (101) and the plurality of conductor strands (S1-S8) of the second layer (103) are arranged to form a mirror image of each other.

* * * * *